(12) United States Patent
Kelin et al.

(10) Patent No.: US 8,495,480 B2
(45) Date of Patent: Jul. 23, 2013

(54) METHOD AND APPARATUS FOR SIGNAL-TO-NOISE RATIO ESTIMATION IN CONVOLUTIONAL CODES (VITERBI) DECODER

(75) Inventors: Timur G. Kelin, Moscow (RU); Nikolay A. Vazhenin, Moscow (RU); Dmitry A. Pyatkov, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 287 days.

(21) Appl. No.: 13/110,050

(22) Filed: May 18, 2011

(65) Prior Publication Data

US 2011/0307767 A1 Dec. 15, 2011

Related U.S. Application Data

(63) Continuation-in-part of application No. PCT/RU2010/000420, filed on Jul. 28, 2010.

(30) Foreign Application Priority Data

Jun. 9, 2010 (RU) .............................. 2010123460
Nov. 17, 2010 (RU) .............................. 2010146690

(51) Int. Cl.
*H03M 13/03* (2006.01)
(52) U.S. Cl.
USPC .......................................... 714/795; 714/794

(58) Field of Classification Search
USPC ................. 714/786, 792, 794, 795, 796, 700, 714/52; 375/341, 262; 708/530
See application file for complete search history.

(56) References Cited

U.S. PATENT DOCUMENTS

| | | | | |
|---|---|---|---|---|
| 6,507,628 B1 * | 1/2003 | McCallister et al. | ......... | 375/341 |
| 7,636,400 B2 * | 12/2009 | Thomson et al. | ............. | 375/260 |
| 8,078,131 B2 * | 12/2011 | Li et al. | ......................... | 455/296 |

* cited by examiner

*Primary Examiner* — Christine Tu
(74) *Attorney, Agent, or Firm* — Bardmesser Law Group

(57) ABSTRACT

A method of estimating signal-to-noise ratio in a Viterbi decoder comprising: setting a threshold SNR value; determining a dependence on SNR of the average decoding path length; filling branch metrics matrix, minimal path metrics matrix, path metrics matrix and paths matrix with initial values; receiving packets from a communication channel; calculating the matrices that contains paths stored during operation of Viterbi algorithm in its rows, and a minimal path metrics matrix, including calculating an estimate of a decoding path length, where all the paths converge, based on the paths matrix; calculating current SNR estimate using an estimate of a decoding path length, based on results of previous steps; setting a decoder control signal to an active state if the current estimated SNR does not exceed the threshold, and to an inactive state otherwise; if the decoder control signal is in active state, the branch metrics matrix, the minimal path metrics matrix, the paths metrics matrix and the paths matrix are filled with the initial values; generating a decoded symbol; and repeating the steps on a next packet if one is available.

19 Claims, 11 Drawing Sheets

METHOD AND APPARATUS FOR SIGNAL-TO-NOISE RATIO ESTIMATION IN CONVOLUTIONAL CODES (VITERBI) DECODER

CROSS-REFERENCE TO RELATED APPLICATIONS

This application is a continuation in part of PCT Application No. PCT/RU2010/000420, filed on Jul. 28, 2010, which claims priority to RU 2010123460, filed on Jun. 9, 2010, which are all incorporated by reference herein in their entirety.

This application claims priority to RU 2010146690, filed on Nov. 17, 2010, which is incorporated by reference herein in its entirety.

BACKGROUND OF THE INVENTION

1. Field of the Invention

The invention generally relates to measuring signal-to-noise ratio (SNR) at an input of a Viterbi decoder and to systems with adaptive decoding of convolutional codes where current SNR value is taken into account.

2. Description of the Related Art

Convolutional coding is widely used in satellite data transmission channels, for example, in data transmission channels of the radio navigation satellite systems (Global Navigation Satellite Systems (GNSS): GPS L5, GPS L2C, Galileo), as well as in other communications systems to transmit differential GNSS corrections from geosynchronous orbit satellites (WAAS, EGNOS).

There are several decoders for convolutional codes that apply Viterbi decoding algorithm (see, for example, U.S. Pat. Nos. 4,802,174; 4,905,317; 5,432,803; 5,390,198; 3,872,432; 4,240,156; 4,493,082; 4,500,994).

Several techniques concerned with decoding using the Viterbi algorithm are disclosed in the following U.S. patents. In particular, the synchronization technique in such a decoder is disclosed in detail in U.S. Pat. No. 3,872,432. The soft decision technique is described in U.S. Pat. Nos. 4,240,156 and 4,493,082. The multi-rate branch metric processor using the soft decision technique is also disclosed in U.S. Pat. No. 4,500,994.

These devices lack the capability of generating current input SNR values.

U.S. Pat. No. 4,802,174 describes an apparatus for decoding convolutional codes comprising serially-connected a branch metrics calculation unit, a path metrics and path memory unit, decoded symbol generation unit, and minimal path metrics memory, path metrics and path memory connected to the path metrics and path memory unit, the decoder input being the input of branch metrics calculation unit, and the output of decoded symbol generation unit is the output.

In the known implementations of Viterbi decoders the following operations are performed.

At the beginning of the decoding branch metrics matrix, minimal path metrics matrix, path metrics matrix and path matrix are filled with initial values for example, all zeros).

Decoding itself is implemented by performing the following operations at each decoding step:

(a) receiving a symbols packet from communication channel;
(b) calculating branch metrics matrix;
(c) calculating path metrics matrix;
(d) calculating paths matrix which in its rows contains paths stored during the operation of Viterbi algorithm;
(e) calculating a minimal path metrics matrix;
(f) generating a decoded symbol;
(g) receiving and processing next packet of the symbols from communication channel if packet is available, otherwise finish the decoding.

Conventional Viterbi decoders can be implemented as the following units connected in series:
(i) a branch metrics calculation unit,
(ii) a path metrics and paths calculation unit, and
(iii) a decoded symbol generation unit.

The following units are connected to the path metrics and paths calculation unit:
(i) a minimal path metrics memory,
(ii) a path metrics memory, and
(iii) a paths memory.

The decoder input is the input of the branch metrics calculation unit and the output of the decoder is the output of decoded symbol generation unit.

However, there is a need for a system and method that provide a possibility for estimating current SNR value at the input of the decoder.

BRIEF SUMMARY OF THE INVENTION

Accordingly, the present invention provides a system and method for estimating signal to noise ratio (SNR) that substantially obviate one or several of the disadvantages of the related art.

The purpose of the proposed invention is achieved by an additional circuitry that estimates current SNR value, which can be used for estimating and indicating the quality of the communication channel, for generating an automatic repeat request of data packet within automatic repeat request communication channels, for selecting a channel with better communication quality in multichannel communication systems, for decoder synchronization, for calculating branch metrics in case of considering conditional probability distribution density parameters, and for some other purposes.

Proposed methods and systems are based on estimating decoding path length, where all the paths converge. Decoder path length is, for example, the graph length on a trellis diagram from the current time instant to the step at which all the alternate paths converge into single path. In addition, the proposed methods and systems are based on the existing dependence of the average number of symbols in each paths matrix column, which are mismatched with the maximum likelihood symbol, estimate on SNR at the decoder input.

The proposed methods and systems provide independence from the input signal magnitude; and provide a wider range of estimated values both for high and low SNRs compared to devices with direct bit error rate estimation (BER monitor).

Conventional Viterbi decoder implementations include filling a branch metrics matrix, a minimal path metrics matrix, a path metrics matrix, a paths matrix with initial values. The first proposed method is different from the conventional ones in that:

(i) a threshold SNR value is set,
(ii) a functional dependence of the average decoding path length, where all the paths converge on SNR, is determined;
(iii) the decoding path length estimate, where all the paths converge, which is based on the paths matrix, is calculated. This length and determined functional dependence are used for current SNR calculation;
(iv) the decoder control binary signal is set to an active state, if the current SNR does not exceed the threshold, and to an inactive state, if current SNR exceeds the threshold; and (v) if the decoder control binary signal is in an active state, branch metrics matrix, minimal path metrics matrix, paths metrics matrix and paths matrix are filled with initial values.

The second proposed method of estimating SNR at the input of the Viterbi decoder includes:

(i) a threshold SNR value is set;

(ii) functional dependencies of average relative number of symbols in a column, that do not match the maximum likelihood symbol in the same column, on SNR are determined for selected columns of the paths matrix;

(iii) average relative number of symbols in a column, that do not match the maximum likelihood symbol in the same column, are calculated for selected columns of the paths matrix. These relative numbers and the determined functional dependencies are used for current SNR calculation;

(iv) the decoder control binary signal is set to active state if current SNR does not exceed the threshold, and to inactive state if current SNR exceeds the threshold; and (v) if the decoder control binary signal is in active state, branch metrics matrix, minimal path metrics matrix, paths metrics matrix and paths matrix are filled with initial values.

A decoder implementing the first proposed method, unlike the conventional ones, includes connected in series a decoding path length estimation unit, where all the paths converge and an SNR estimation unit.

The input of the decoding path length estimation unit, where all the paths converge, is connected to the second output of paths memory, while the first output of the SNR estimation unit is connected to the first control input of branch metrics calculation unit and to the control input of path metrics and paths calculation unit, the second output of the SNR estimation unit is connected to the second control input of branch metrics calculation unit and serves as the second decoder output, where a signal corresponding to the current SNR estimate during decoder operation is generated.

In the decoder implementing the second proposed method the first input of SNR estimation unit is connected to the second output of said paths memory. The second input of SNR estimation unit is connected to the fifth output of path metrics and paths calculation unit. The first output of SNR estimation unit, on which a binary control signal is generated during operation, is connected to the first control input of branch metrics calculation unit and to the control input of the path metrics and paths calculation unit. The second output of SNR estimation unit is connected to the second control input of the branch metrics calculation unit and serves as the second decoder output on which the signal corresponding to the current SNR estimate is generated during the decoder operation.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention. In the drawings.

Figure 6:
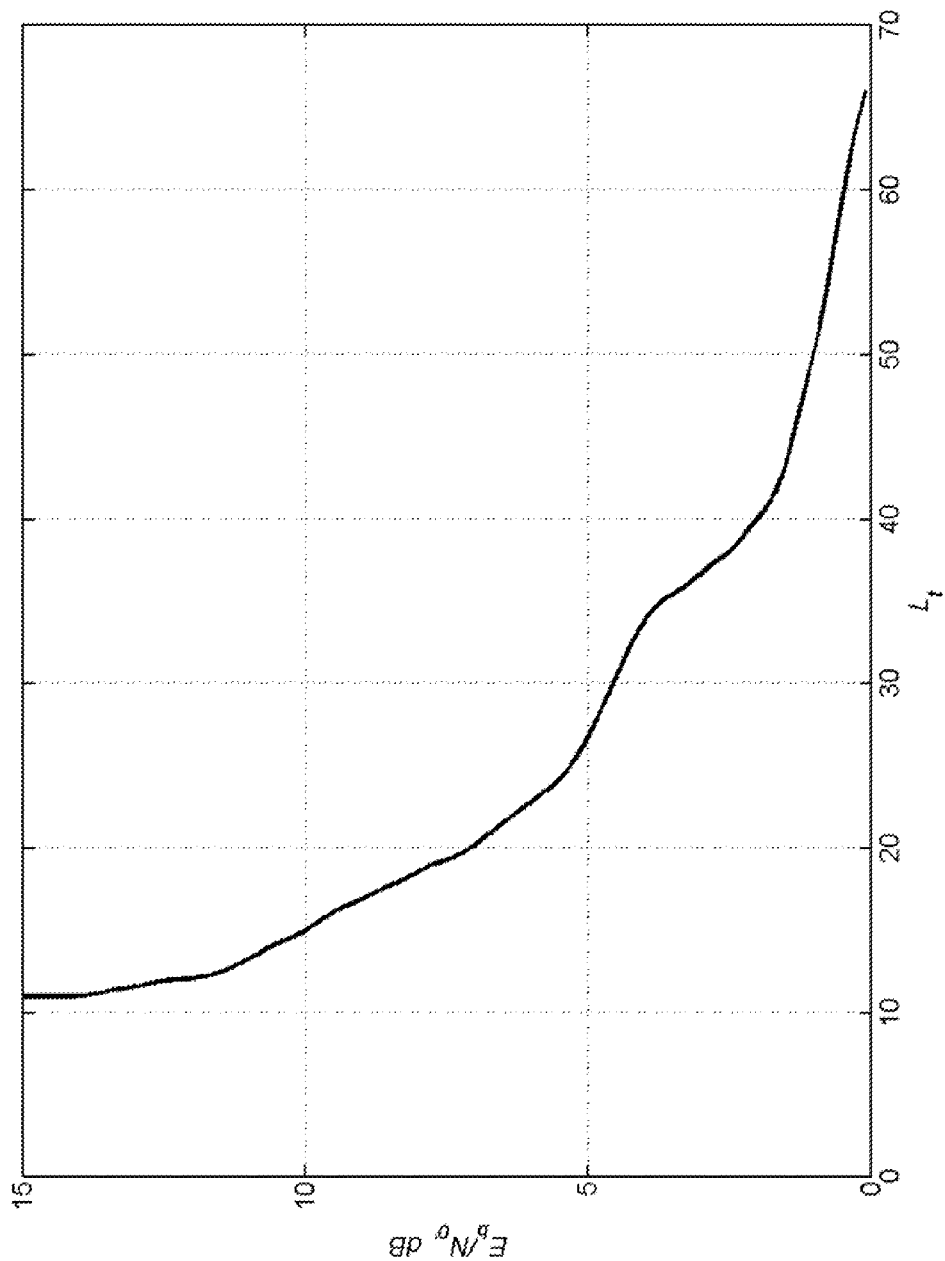

FIG. 6 gives an example of a graph of dependence of input bit SNR ($E_b/N_0$) on average decoding path length where all the paths converge $L_t$.

Figure 7:
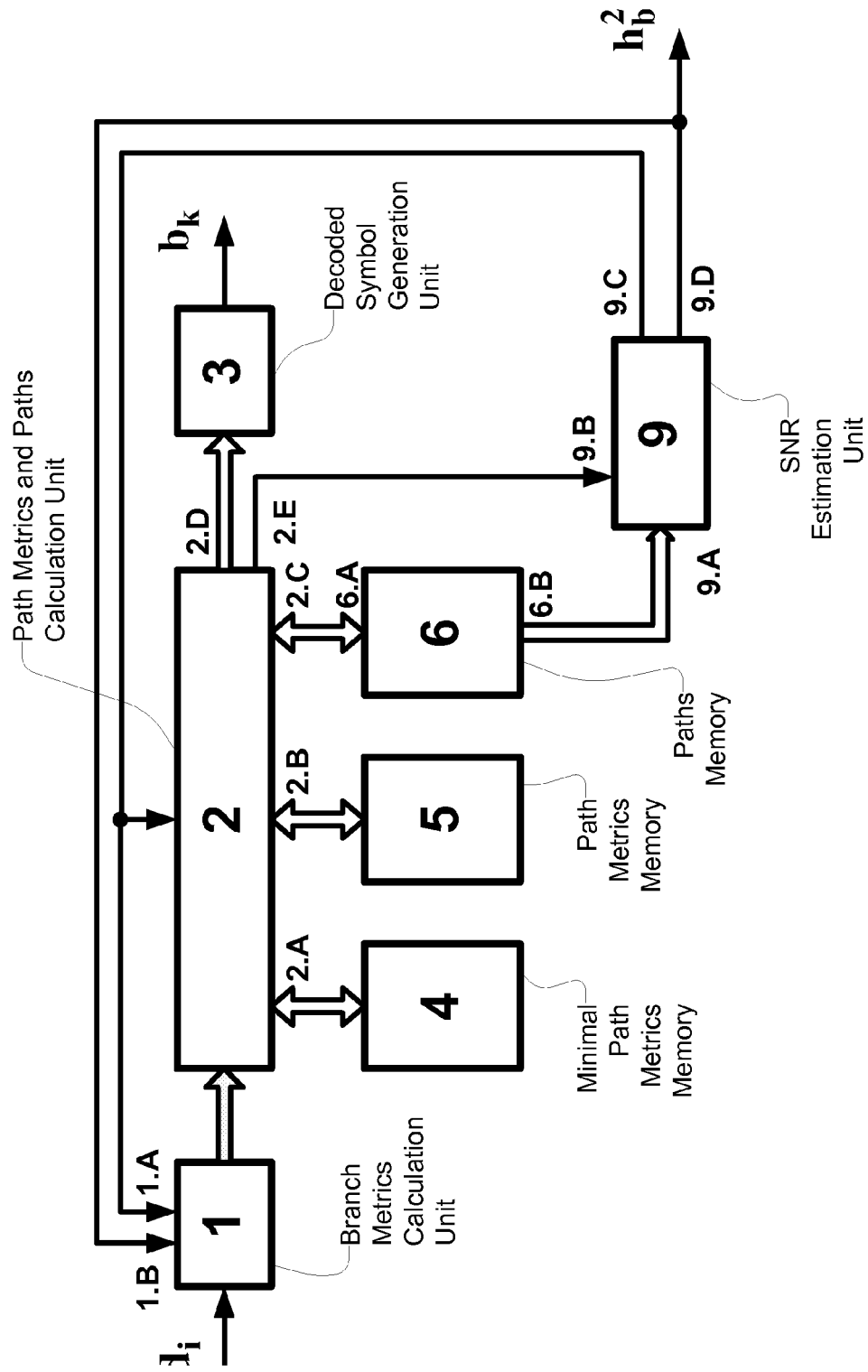

FIG. 7 illustrates a block diagram of the second proposed decoder.

Figure 8:
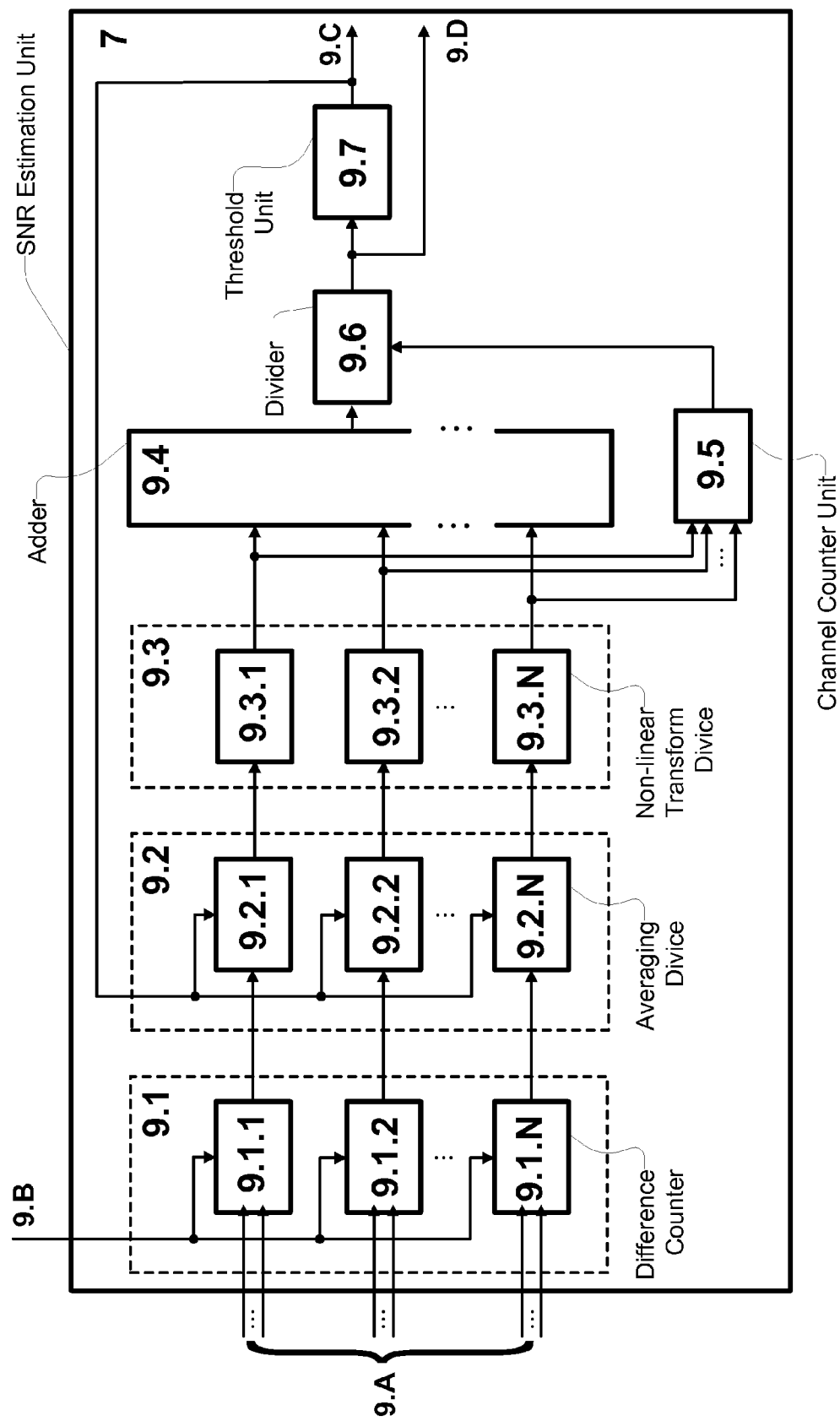

FIG. 8 illustrates an embodiment of an SNR estimation unit according to the second proposed decoder.

Figure 9:
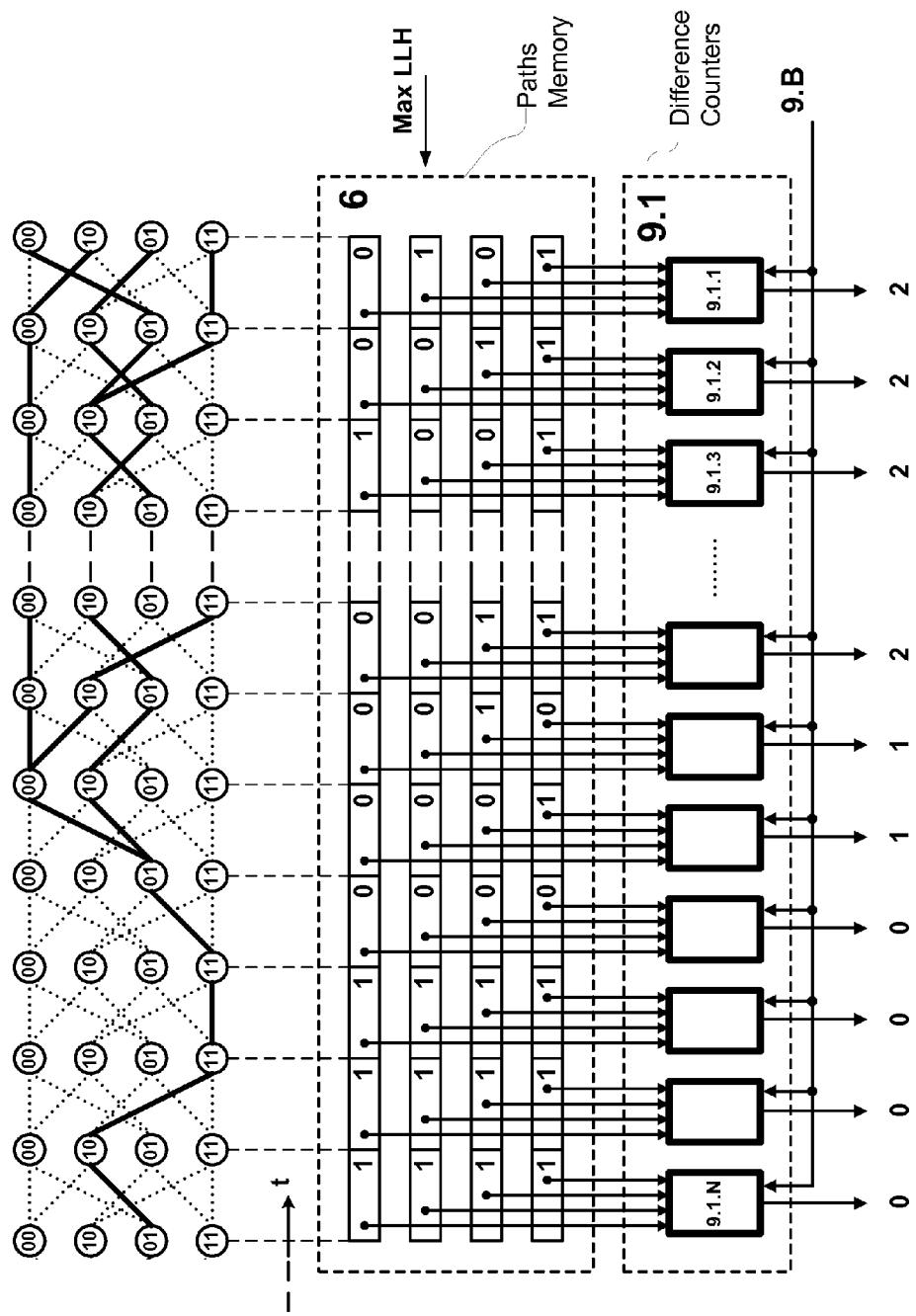

FIG. 9 illustrates the use of data from the decoding paths memory for estimation of the number of mismatches in each column of decoding paths memory cells and connections of the combinational logic unit inputs to the decoding paths memory cells.

Figure 10:
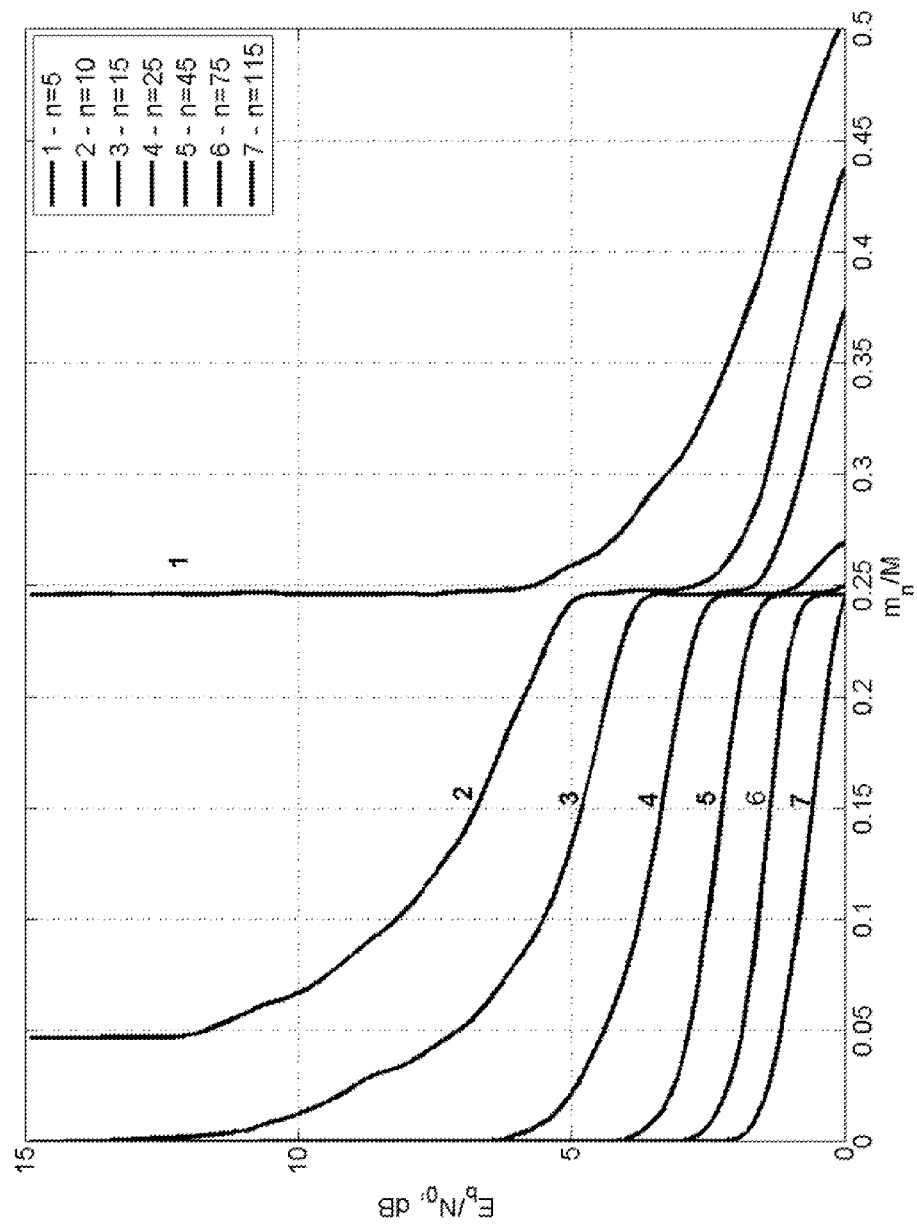

FIG. 10 gives an example of a graph of dependence of input bit SNR ($E_b/N_0$) on normalized average bit number $m_n/M$ that is not equal to the maximum likelihood value for different columns of the decoding paths memory cells (n=5 . . . 115).

Figure 11:
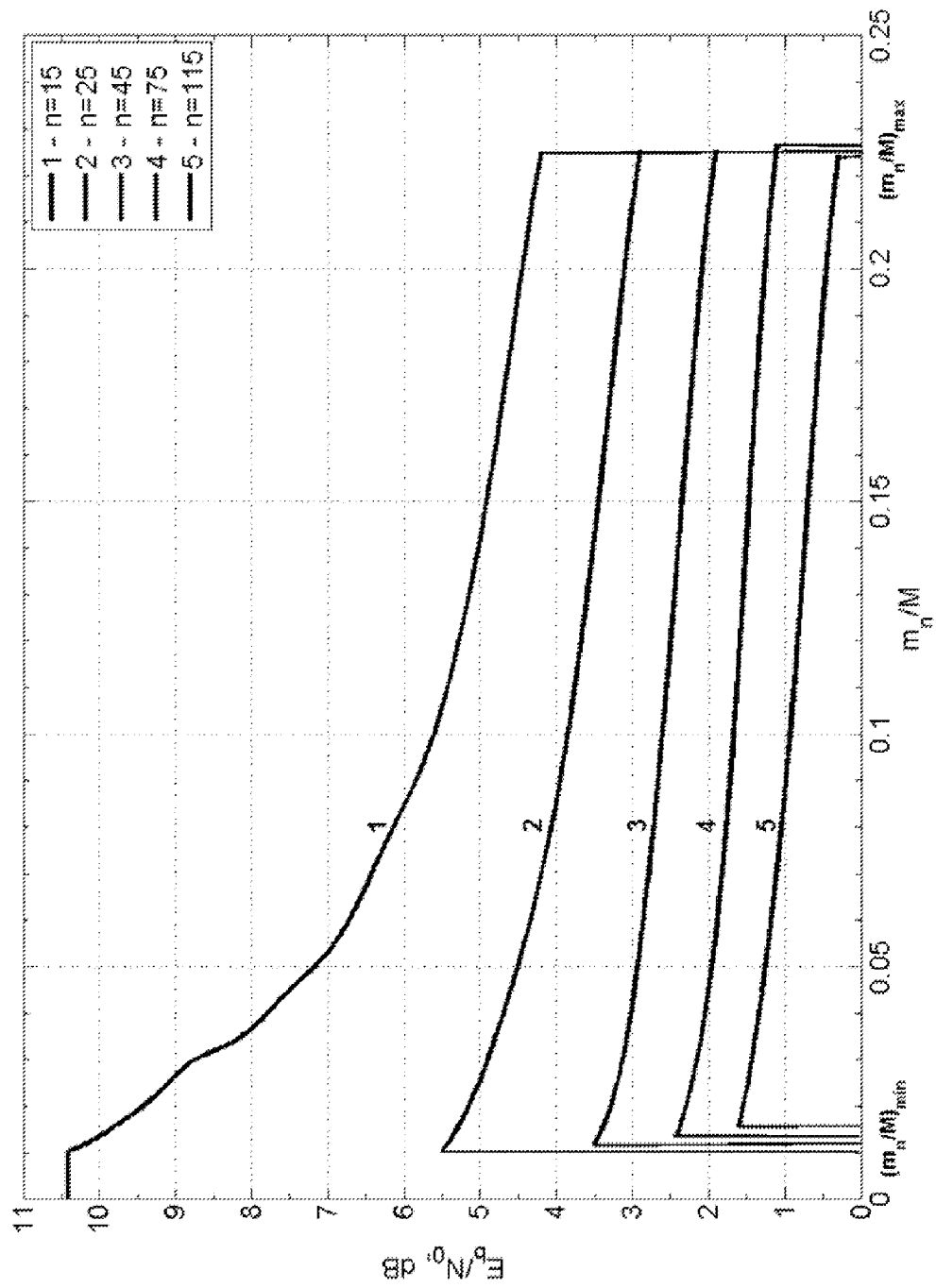

FIG. 11 gives an example of amplitude characteristics of the non-linear converters.

DETAILED DESCRIPTION OF THE INVENTION

Reference will now be made in detail to the embodiments of the present invention, examples of which are illustrated in the accompanying drawings.

The first proposed method uses the following steps:

(a) setting a threshold SNR value;

(b) determining a functional dependence of the average decoding path length, where all the paths converge, on SNR;

(c) calculating the decoding path length, where all the paths converge, whose estimate is based on the paths matrix. This length and determined functional dependence are used for current SNR estimate calculation;

(d) setting a decoder control binary signal in an active state, if current estimated SNR does not exceed the threshold, and in an inactive state, if current estimated SNR exceeds the threshold;

(e) if the decoder control binary signal is in an active state, branch metrics matrix, minimal path metrics matrix, paths metrics matrix and paths matrix are filled with initial values.

The first version of this method implementation is where the decoding path length where all the paths converge is calculated as a maximum difference between such paths matrix column positions that have at least one element different from the others.

The second version of this method is where the decoding path length, for which all the paths converge, is calculated as a maximum number of the paths matrix column position that has at least one element different from the others, relative to the column position corresponding to the current time instant.

The third version of this method is where the SNR estimate is calculated using the following steps:

(i) assigning a time interval for averaging the decoding path length, where all the paths converge, estimate;

(ii) finding an average estimate of the decoding path length, where all the paths converge, for the given interval;

(iii) calculating an SNR estimate by using the found average estimate and using the functional dependence on SNR of average decoding path length, where all the paths converge.

The fourth version of this method implementation is where the binary control signal is generated by comparing the current estimated SNR with the preset threshold value; if current estimated SNR exceeds the threshold, then control signal is set to an inactive state; otherwise, it is set to an active state.

The second proposed method uses the following:

(i) setting a threshold SNR value;

(ii) Selected columns in the paths matrix are going to be analyzed. In each column there is a maximum likelihood symbol which corresponds to the maximum likelihood path. Other symbols in the column may or may not be equal to this maximum likelihood symbol. So, an average number of mismatched symbols in each column is determined over time. The averages for each column are fed through a non-linear transform block, and an effective SNR can be calculated.

(iii) calculating the SNR estimate using path matrix data and symbols on the maximum likelihood path;

(iv) setting a decoder control binary signal in an active state, if current estimated SNR does not exceed the threshold, and in an inactive state, if current estimated SNR exceeds the threshold;

(v) if the decoder control binary signal is in an active state, branch metrics matrix, minimal path metrics matrix, paths metrics matrix and paths matrix are filled with initial values.

The first version of this method is where the current SNR estimate is calculated as follows:

(i) assigning a time interval for averaging the relative number of symbols in the columns of the paths matrix, that do not match the maximum likelihood symbols in the same columns;

(ii) calculating a relative number of symbols mismatching the maximum likelihood value taken from path metrics and path metrics calculation unit for the selected paths matrix columns;

(iii) calculating averages over the assigned time interval of the relative number of symbols mismatching the maximum likelihood value taken from path metrics and path metrics calculation unit for the selected paths matrix columns;

(iv) calculating the SNR estimate for each selected paths matrix column using the averages of the relative number of symbols over the assigned time interval and functional dependence of average relative number of mismatched symbols on SNR; and (v) calculating average SNR over all selected paths matrix columns which is current SNR estimate.

The second version of this method is where a binary control signal is generated by comparing the current SNR estimate and the threshold; if the current SNR estimate exceeds the threshold, control signal is set to an inactive state, otherwise the control signal is set to an active state; if the control signal is set to the active state then branch metrics matrix, minimal path metrics matrix, paths metrics matrix and paths matrix are filled with initial values and new averages over the assigned time interval of the relative number of symbols mismatching the maximum likelihood symbols for the selected paths matrix columns are calculated.

Figure 1:
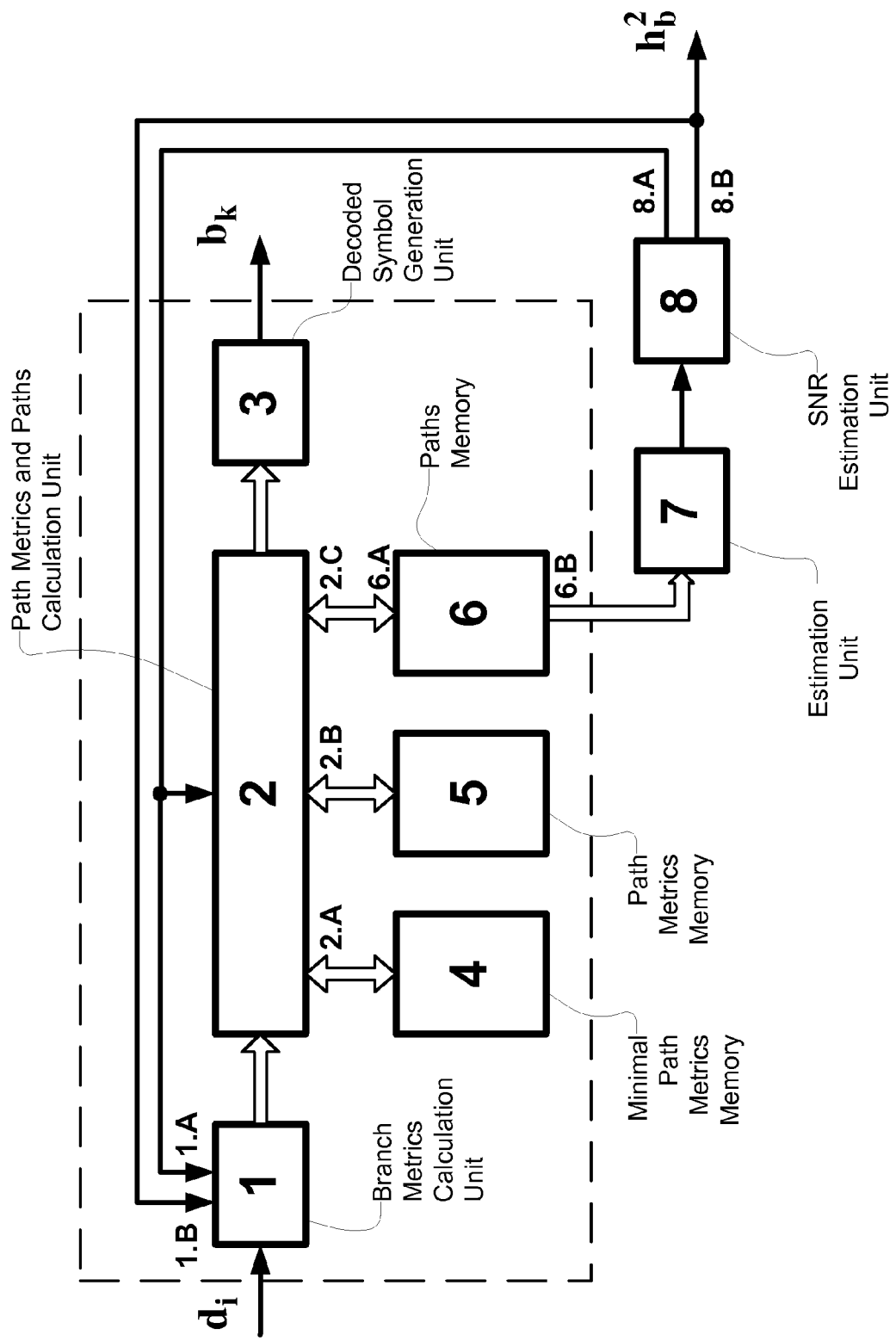
FIG. 1 illustrates a block diagram of a first proposed decoder.

As shown in the figures described below (FIG. 1), the decoder that implements the first method includes a decoding path length, where all the paths converge, estimation unit (7) and an SNR estimation unit (8), connected in series.

The input of the decoding path length, where all the paths converge, estimation unit (7) being connected to the second output (6.B) of paths memory (6), while the first output (8.A) of an SNR estimation unit (8) is connected to the first control input (1.A) of branch metrics calculation unit (1) and to the control input of path metrics and paths calculation unit (2), the second output (8.B) of the SNR estimation unit (8) is connected to the second control input (1.B) of branch metrics calculation unit (1) and serves as the second decoder output, where a signal corresponding to the current SNR estimate during decoder operation is generated. For example it may be bit SNR estimation, i.e., $h_b^2 = E_b/N_0$.

Figure 2:
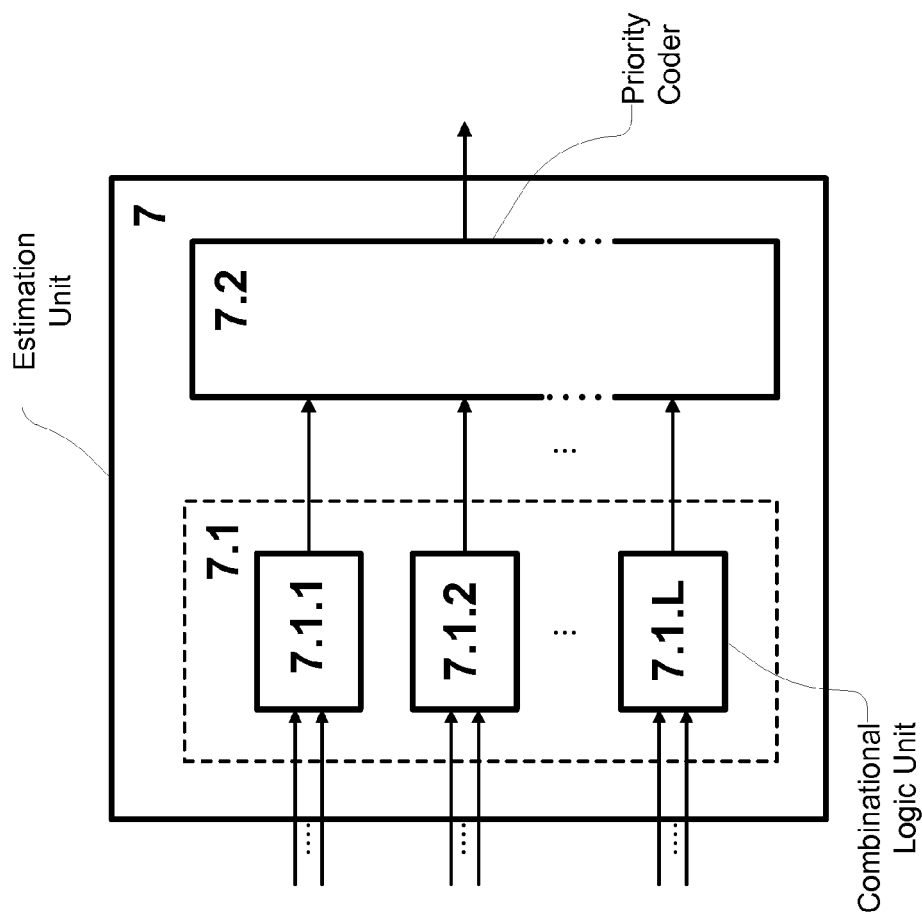
FIG. 2 illustrates an embodiment of the estimator of the decoding path length, where all the paths converge.

An embodiment of this decoder includes an estimation unit (7) that estimates a decoding path length where all the paths converge, and includes the following elements (see FIG. 2):

(i) a group (7.1) of combinational logic units (7.1.1-7.1.L), whose number of is equal to the decoding depth while the number of inputs of each logic unit is equal to the number of states of the convolutional coder M; and (ii) priority coder (7.2), whose number of inputs is equal to the number of combinational logic units L;

The output of each combinational logic unit (7.1.x) is connected to the corresponding input of the priority coder (7.2); the input of the path length estimation unit (7) is all the inputs of combinational logic units (7.1.x), while the output of the unit is the output of the priority coder (7.2).

Figure 3:
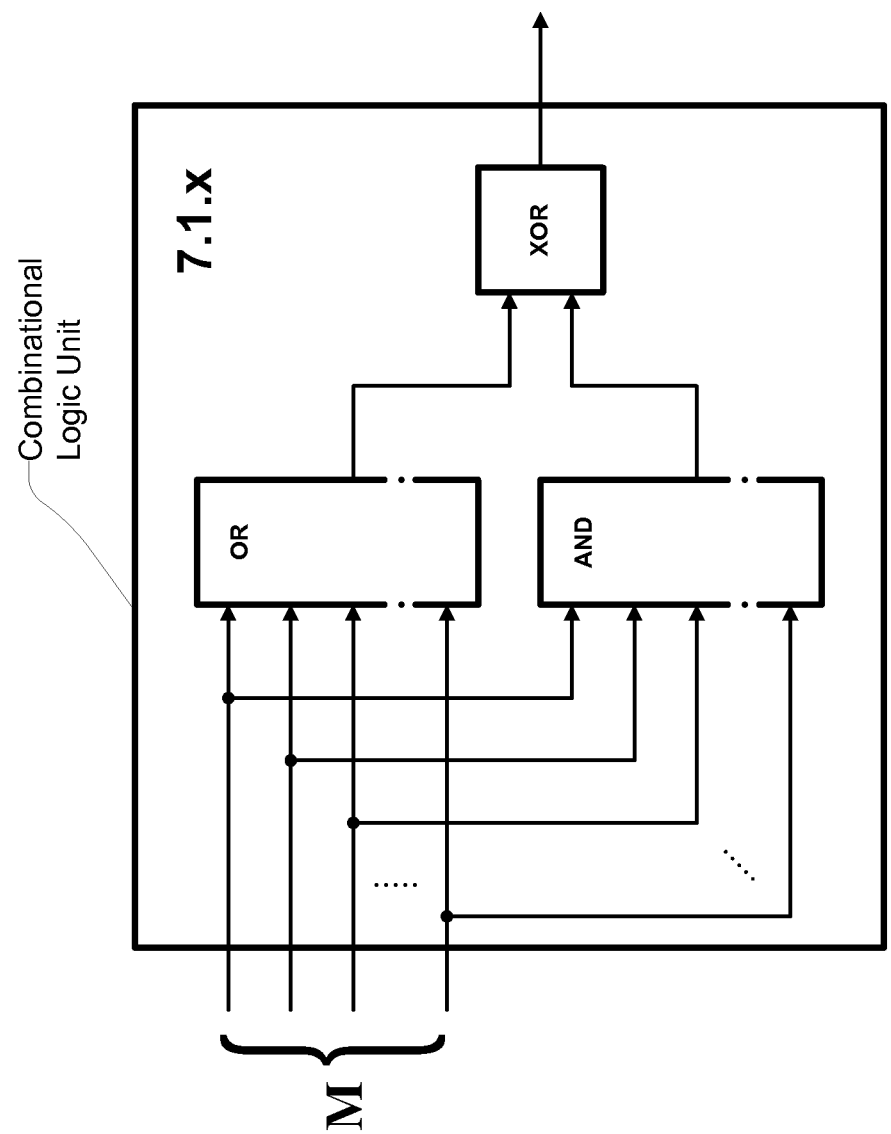
FIG. 3 illustrates an embodiment of combinational logic.

FIG. 3 shows an implementation of the combinatory logic unit (7.1.x) using standard logic elements.

Another embodiment of the proposed decoder is where the SNR estimation unit (8) is made of the units connected in series (FIG. 4):

(i) an averaging unit (8.1);

(ii) a nonlinear transform unit (8.2); and (iii) a threshold unit (8.3).

The output of the threshold unit (8.3) is connected to the control input of the averaging unit (8.1) and serves as the first output (8.A) of the SNR estimation unit (8). An abnormal decoder operation state binary signal is generated at the output (8.A). The second output (8.B) of the SNR estimation unit (8) is the output of the nonlinear transform unit (8.2), where a signal corresponding to the current SNR estimate is generated.

The first proposed method and corresponding decoder are implemented as follows (see FIG. 1):

A set of samples $d_i$ corresponding to the received channel symbols packet comes to the input of branch metrics calculation unit (1), where branch metrics for all possible states on the trellis diagram are calculated according to the received samples and taking into account conditional probabilities distribution density, whose mean square value is determined from the estimated SNR value at the decoder input (1.B).

The calculated set of branch metrics is passed to the input of the path metrics and paths calculation unit (2), where the path metrics matrix, minimal path metrics matrix and paths matrix are calculated in accordance to Viterbi algorithm. The calculated result matrixes are written (FIG. 1) to the minimal path metrics memory (4), path metrics memory (5) and paths memory (6) respectively.

The decoded symbol generation unit (3) forms a decoded symbol $b_k$ based on data from the paths memory (6) and the path metrics memory (5). The decoded symbol $b_k$ is the decoded data output of the decoder.

In addition, at each decoding step, a state of each cell of the paths matrix which is stored in the paths memory (6), is passed to the path length estimation unit (7). The diagram of the estimation unit (7) is shown on FIG. 2. It contains the group of combinatory logic units (7.1) and the priority coder (7.2).

In the path length estimation unit (7) binary data from the cells of each paths matrix column is passed to the corresponding inputs of combinational logic units (7.1.x) where x=1 ... L and L is the maximum depth of the decoder history (decoding window); the number of columns in paths matrix corresponds to this depth.

Each cell of the paths matrix is assumed to contain a binary symbol corresponding to the decoded symbol estimate for that moment and which brings the decoder to the specific state on the trellis diagram.

An exemplary embodiment of combinational logic units (7.1.x) using standard logic elements is illustrated on FIG. 3.

Data from the each column of the paths matrix is passed to the inputs of corresponding combinational logic unit (7.1.x). The number of inputs of each combinational logic unit (7.1.x) is equal to the number of states on the trellis diagram $M=2^{K-1}$, where K is the constraint length of the used code.

An inactive state is generated at the output of each combinational logic unit (7.1.x) if all binary symbols in the corresponding paths matrix column are the same, and an active state is generated if at least one symbol in the corresponding paths matrix column is different from the others. This operation is illustrated on FIG. 5.

The number L of combinational logic units (7.1.1-7.1.L) is equal to the maximally-allowed depth of the decoder history (the number of paths matrix columns) L, and for the present description, consider combinational logic unit (7.1.1) corresponding to the minimal depth of the decoder history 1, while combinational logic unit (7.1.L) corresponding to the maximal depth of the decoder history L.

Figure 5:
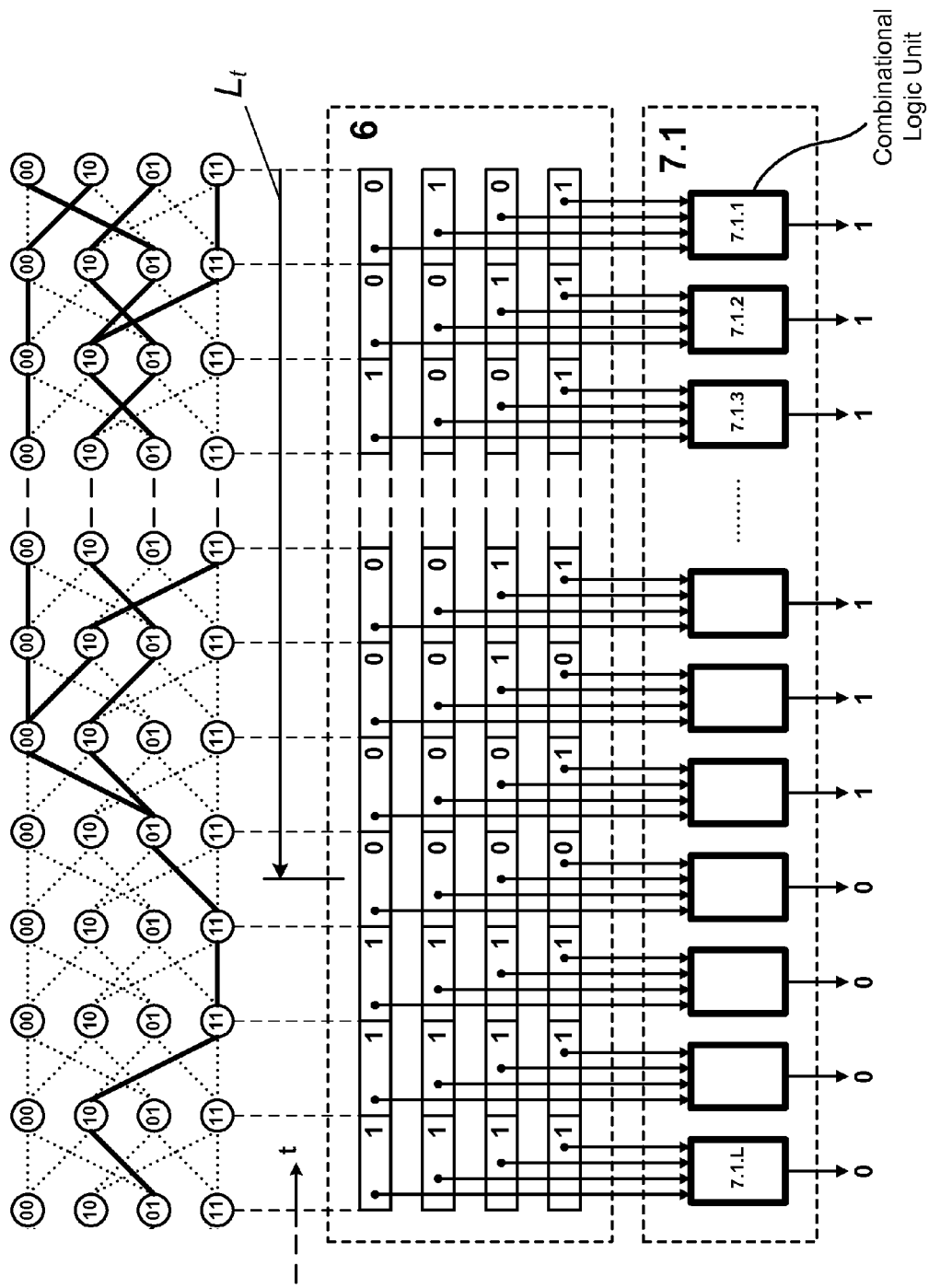
FIG. 5 illustrates the use of data from the decoding paths memory for the estimation of the decoding path length, where all the paths converge and connections of the combinational logic unit inputs to the decoding paths memory cells.

From FIG. 5, the current decoding path length, where all the paths converge, can be estimated by determining the maximum position number of the combinational logic unit (7.1.x) (the left-most) which has an active state at its output.

This operation is performed by the priority coder (7.2) that determines the left-most position of logic "1" in the parallel code generated by outputs of combinational logic units (7.1.x), and outputs a code corresponding to the position number corresponding to the current decoding path length, where all the paths converge $L_f$. The active state equals a logic "1", while the inactive state equals a logic "0" in the corresponding code position.

Figure 4:
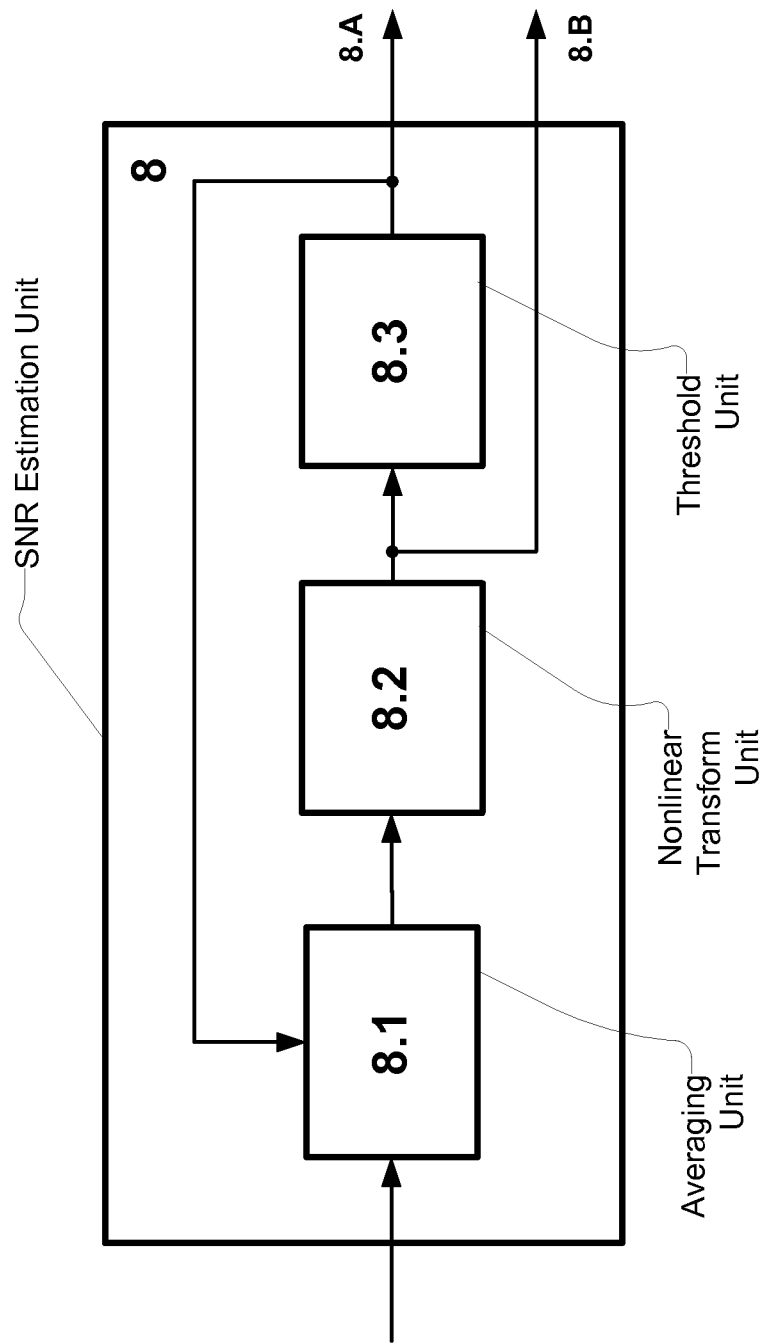
FIG. 4 illustrates an embodiment of an SNR estimation unit.

A signal from the output of the priority coder, which also serves as output signal of the path length estimation unit is passed to the input of the SNR estimation unit (8) which includes serially-connected units: an averaging unit (8.1), a nonlinear transform unit (8.2) and a threshold unit (8.3). The output of the threshold unit (8.3) is connected to the control input of the averaging unit (8.1). The implementation variant for the SNR estimation unit (8) is shown in FIG. 4.

Averaging unit (8.1) averages a value of the decoding path length, where all the paths converge, estimate over the given time interval. The averaging interval is normally chosen longer than maximum decoder history depth L.

The nonlinear transform unit (8.2) transforms a value generated at the output of the averaging unit (8.1) into a value corresponding to the current SNR estimate.

An example of the amplitude characteristic for nonlinear transform unit (8.2) is given in FIG. 6. This characteristic was computer-simulated for convolutional code with code rate R=½ and code constraint K=7. This characteristic allows determining the SNR at the decoder input based on the measured current decoding path length, where all the paths converge $L_f$. Such a dependence can be obtained experimentally or by modeling for each decoder type.

The threshold unit (8.3) outputs an active state if SNR estimate at its input is lower than the preset threshold, otherwise it outputs an inactive state. In such a manner, a critically long decoding path length, where all the paths converge, is determined. The excessive decoding path length, where all the paths converge, informs either about frequency of error occurrence that is higher than correcting capability of the code, or about incorrect synchronization with the channel symbol sequence at the decoder input.

A signal from the output of the threshold unit (8.3) is passed to the control input of the averaging unit (8.1). If control input is set to an active state, then averaging unit (8.1) is reset, and its output is set to zero.

At the same time the output signal from the threshold unit (8.3) serves as the first output (8.A) of the SNR estimation unit (8) and is passed to the first control input (1.A) of the branch metrics calculation unit (1) and to the control input of the path metrics and paths calculation unit (2). Branch metrics calculation unit (1) with an active state at its first control input (1.A) skips one sample in the input stream to attempt to synchronize. Path metrics and paths calculation unit (2), with an active state at its control input, sets contents of the minimal path metrics memory (4), the path metrics memory (5) and the paths memory (6) to the initial state. After that, the decoding procedure restarts.

External units may also use a signal from the first output (8.A) of the SNR estimation unit (8), for example, to optimize receive procedure, in particular, to inform that the current and several of the subsequent bits from the decoder output are incorrect.

The signal from the output of nonlinear transform unit (8.2) corresponds to the current SNR estimate at the decoder input and serves as the second output (8.B) of SNR estimation unit (8) and is passed to the second control input (1.B) of branch metrics calculation unit (1). Calculation of branch metrics is performed with taking into account conditional probabilities distribution densities, whose mean square value is determined based on the SNR estimate at the decoder input. Current SNR estimate can also be used by external units of the receiver system to optimize the receive procedure.

In the decoder according to FIG. 7, the first input (9.A) of the SNR estimation unit (9) is connected to the second output (6.B) of the paths memory unit (6), the second input (9.B) of the SNR estimation unit (9) is connected to fifth output (2.E) of the path metrics and path calculation unit (2); the first output (9.C) of the SNR estimation unit (9) is connected to the first control input (1.A) of the branch metrics calculation unit (1) and to the control input of the path metrics and path calculation unit (2); the second output (9.D) of the SNR estimation unit (9) is connected to the second control input (1.B) of the branch metrics calculation unit (1) and serves as the second decoder output, where the signal corresponding to, for example, the current estimate of bit SNR $h_b^2=E_b/N_0$, is generated.

An embodiment of the proposed decoder is where the SNR estimation unit (9) is made of the units connected in series (see FIG. 8):

(i) an N-channel unit (9.1) of difference counters (9.1.x). The first input of each difference counter (9.1.x) is multichannel, with the number of channels M equal to the number of convolutional coder states $M=2^{K-1}$, where K is the constraint length of the used code, while the second input (9.B) of each difference counter (9.1.x) is single-channel; all the second inputs of difference counters are connected together and serve as the second input (9.B) of the SNR estimation unit (9), while the first input (9.A) of the SNR estimation unit (9) is a set of N first M-channel inputs of difference counters;

(ii) an N-channel unit (9.2) of averaging devices (9.2.x);

(iii) an N-channel unit (9.3) of nonlinear transform devices (9.3.x);

(iv) an adder (9.4);

(v) a divider (9.6);

(vi) a threshold unit (9.7); and (vii) a channel counter unit (9.5).

The output of each nonlinear transform device (9.3.x) in the N-channel nonlinear transform unit (9.3) is connected to the corresponding input of said channel counter unit (9.5), while the output of channel counter unit (9.5) is connected to the second input of the divider (9.6). The output of the threshold unit (9.7) is connected to the control inputs of averaging devices (9.2.x) in the N-channel averaging unit (9.2) and serve as the first output (9.C) of the SNR estimation unit (9) at which abnormal decoder operation state binary signal is generated. The second output (9.D) of the SNR estimation unit (9) is the output of said divider (9.6) at which a signal corresponding to the current SNR estimate (e.g. input bit SNR estimate $h_b^2 = E_b/N_0$) is generated during decoder operation.

The principle of operation of the proposed decoder is shown in FIGS. 7-11. Each cell of the paths matrix is assumed to contain a binary symbol corresponding to the decoded symbol estimate for that moment and which brings the decoder to the specific state on the trellis diagram.

A set of samples $d_i$ corresponding to the received channel symbols packet comes to the input of branch metrics calculation unit (1) (FIG. 7) where branch metrics for all possible states on the trellis diagram are calculated according to the received samples and taking into account conditional probabilities distribution density, whose mean square value is determined from the estimated SNR value at the decoder input.

The calculated set of branch metrics is passed to the input of the path metrics and paths calculation unit (2), where the minimal path metrics matrix, path metrics matrix and paths matrix are calculated based on the Viterbi algorithm. The calculated result matrixes are written to the minimal path metrics memory (4), path metrics memory (5) and paths memory (6) respectively.

Decoded symbol generation unit (3) forms a decoded symbol $b_k$ based on data from the paths memory (6) and path metrics memory (5). The decoded symbol $b_k$ is the decoded data output of the decoder.

SNR estimation unit (9) calculates an estimate of the current SNR at the decoder input based on the data from the paths memory (6) and the path metrics and paths calculation unit (2), and outputs this estimate to the second output (9.D) of the SNR estimation unit (9), while a "low SNR" binary signal is generated on the first output (9.C) of the SNR estimation unit (9), which indicates the abnormal decoder operation state.

In the SNR estimation unit (9) binary data corresponding to the contents of the selected paths matrix columns (FIG. 8 and FIG. 9) is passed to the corresponding inputs of difference counters (9.1.x), where x=1 ... N and N<L, L is the maximal decoder history depth (decoding window), which is equal to the total number of the columns in the paths matrix. The number of the first information data inputs of each difference counter (9.1.x) equals to the number of convolutional coder states $M = 2^{K-1}$, where K is the constraint length of the used code.

The quantity and positions of the paths matrix columns used for SNR estimation are selected considering the acceptable technical complexity level and required SNR estimation accuracy. The position of the first paths matrix column used for estimation should be greater than the minimally-possible decoding path length, where all the paths converge (i.e., the extremely high SNR condition).

The number of the row in the paths matrix corresponding to the maximum likelihood path, i.e., the path with minimal path metric at the given time instant, is passed to the second input (9.B) of all difference counters (9.1.x) from the path metrics and paths calculation unit (2).

Each difference counter (9.1.x) takes the corresponding paths matrix column contents and calculates the number of cells of this column which have values different from the value from the cell with the row number of the path with maximum likelihood (Max LLH). An example of such calculation is given in FIG. 9 at the bottom of the figure.

Output of each difference counter (9.1.x) at each decoding step is averaged with, for example, moving average algorithm in the N-channel unit (9.2) of averaging devices (9.2.x). The control inputs of the averaging devices (9.2.x) are connected together and serve to apply reset signal for averaging elements when abnormal decoder operation is detected. The averaging interval is normally selected to be greater than the maximum decoder history depth L.

The outputs of the averaging devices (9.2.x) are connected to the corresponding inputs of N-channel unit (9.3) of non-linear transform devices (9.3.x). Each non-linear transform device (9.3.x) converts the averaged value of the difference number, which was generated at the outputs of the averaging elements (9.2.x), into the SNR estimate at the decoder input. To perform such a conversion, dependencies of normalized average bit number $m_n/M$ not equal to the maximum likelihood value on SNR (FIG. 10) can be applied for different columns (n=5 ... 115) of the paths matrix. Column numbering in FIG. 10 is from the most right column corresponds to the current time instant.

An example of the amplitude characteristics for nonlinear transform devices (9.3.x) is given on FIG. 11. This characteristic was computer-simulated for convolutional code with code rate R=½ and code constraint K=7. Such dependencies can be obtained experimentally or by modeling for each decoder type and specific position numbers of the paths matrix columns.

As shown in to FIG. 11, the output of each non-linear transform device (9.3.x) may have zero value if the input signal is out of the assigned working range or a non-zero value corresponding to the SNR estimate. To provide capability of measuring large SNR values, amplitude characteristic of the first non-linear transform device (9.3.1) in the area of small values of $m_n/M$ has a constant non-zero value that equals the SNR for the lower value of $m_n/M$ range for the given channel (see FIG. 11).

To average SNR estimates over different channels, signals from outputs of non-linear transform devices (9.3.x) are added in the adder (9.4) and are divided in the divider (9.6) by the number of channels with non-zero output. The number of channels with non-zero output is determined in the channel counter unit (9.5).

The output of the divider serves as the second output (9.D) of SNR estimation unit (9) and is connected to the second control input (1.B) of the branch metrics calculation unit (1), at the same time it serves as the second decoder output with the current SNR estimate outputted during the operation.

The threshold unit (9.7) outputs an active state if SNR estimate at its input is lower than the preset threshold, otherwise, it outputs an inactive state. In such a manner, a critically long decoding path length, where all the paths converge, is determined. The excessive decoding path length, where all the paths converge, informs either about frequency of error occurrence higher than correcting capability of the code, or about incorrect synchronization with the channel symbol sequence at the decoder input.

A signal from the output of the threshold unit (9.7) is passed to the control inputs of the averaging devices (9.2.*x*). If control input is set to active state then averaging devices (9.2.*x*) are reset and their outputs are set to zero value.

The output of the threshold unit (9.7) serves as the first output (9.C) of the SNR estimation unit (9) and is passed to the first control input (1.A) of the branch metrics calculation unit (1) and to the control input of the path metrics and paths calculation unit (2).

The branch metrics calculation unit (1), with an active state at its first control input (1.A), skips one input sample trying to establish synchronization to the input stream.

The path metrics and paths calculation unit (2) with an active state at its control input sets the cells of the minimal path metrics memory (4), path metrics memory (5) and paths memory (6) to initial states. Then, the decoding procedure restarts.

External units may also use a signal from the first output (9.C) of the SNR estimation unit (9), for example, to optimize receive procedure, in particular, to inform that the current and several of the subsequent bits from the decoder output are incorrect.

The proposed technical solutions enable current SNR estimates at the decoder input to be generated; this eliminates the drawbacks of the solutions known in the prior art and can be used for estimating and indicating the quality of the communication channel, for generating an automatic repeat request of data packet within automatic repeat request communication channels, for selecting a channel with better communication quality in multichannel communication systems, for decoder synchronization, and for calculating branch metrics in case of considering conditional probability distribution density parameters, and for some other needs.

Having thus described a preferred embodiment, it should be apparent to those skilled in the art that certain advantages of the described method and apparatus have been achieved. It should also be appreciated that various modifications, adaptations, and alternative embodiments thereof may be made within the scope and spirit of the present invention. The invention is further defined by the following claims.

What is claimed is:

1. An apparatus for signal-to-noise ratio (SNR) estimation in a convolutional codes decoder, the apparatus comprising:
   a branch metrics calculation unit, a path metrics and paths calculation unit and a decoded symbol generation unit, all connected in series;
   a minimal path metrics memory, a path metrics memory and a paths memory connected to the path metrics and paths calculation unit;
   a decoding path length estimation unit, where all paths calculated by the path metrics and paths calculation unit converge, the decoding path length estimation unit connected in series with an SNR estimation unit,
   wherein an input of the decoding path length estimation unit is connected to a first output of the paths memory,
   wherein a first output of the SNR estimation unit is connected to a first control input of the branch metrics calculation unit and to a control input of the path metrics and paths calculation unit, and
   wherein a second output of the SNR estimation unit is connected to a second control input of the branch metrics calculation unit and serves as a second decoder output that represents a current SNR estimate.

2. The apparatus of claim 1, wherein the decoding path length estimation unit includes:
   a plurality of combinational logic units, wherein a number of the combination logic units is equal to a decoding depth,
   wherein a number of inputs of each combinational logic unit is equal to a number of states of a convolutional coder, and
   a priority coder, whose number of inputs is equal to the number of combinational logic units,
   wherein an output of each combinational logic unit is connected to a corresponding input of the priority coder;
   wherein the input of the decoding path length estimation unit is connected to inputs of combinational logic units, and
   wherein an output of the decoding path length estimation unit is the output of the priority coder.

3. The apparatus of claim 1, wherein the SNR estimation unit includes an averaging unit, a nonlinear transform unit and a threshold unit, all connected in series;
   wherein an output of the threshold unit is connected to a control input of the averaging unit and serves as the first output of the SNR estimation unit based on which an abnormal decoder operation state binary signal is generated; and
   wherein the second output of the SNR estimation unit is an output of the nonlinear transform unit based on which the current SNR estimate is generated.

4. An apparatus for signal-to-noise ratio (SNR) estimation in a convolutional codes decoder, the apparatus comprising:
   a branch metrics calculation unit;
   a path metrics and paths calculation unit connected in series to the branch metrics calculation unit;
   a decoded symbol generation unit connected in series to the path metrics and paths calculation unit;
   a minimal path metrics memory;
   a path metrics memory;
   a paths memory; and
   an SNR estimation unit,
   wherein a decoder input is the input of a branch metrics calculation unit and a first decoder output is an output of the decoded symbol generation unit,
   wherein a first input of the SNR estimation unit is connected to a first output of the paths memory,
   a second input of the SNR estimation unit is connected to a first output of the path metrics and paths calculation unit,
   a first output of the SNR estimation unit that generates a binary control signal is connected to a first control input of the branch metrics calculation unit and to a control input of the path metrics and paths calculation unit,
   a second output of the SNR estimation unit is connected to a second control input of the branch metrics calculation unit and serves as a second decoder output, based on which a current SNR estimate is generated.

5. The apparatus of claim 4, wherein the SNR estimation unit includes the following components, connected in series:
   an N-channel unit of difference counters, such that a first input of each difference counter has M channels, with the number M equal to a number of convolutional coder states;
   an N-channel unit of averaging devices;
   an N-channel nonlinear transform unit of nonlinear transform devices;
   an adder;
   a divider;
   a threshold unit; and
   a channel counter unit, wherein a second input of each difference counter is single-channel, wherein all the second inputs of the difference counters are connected together and serve as the second input of the SNR estimation unit, wherein the first input of the SNR estimation unit is a set of N first M-channel inputs of difference counters, wherein an output of each nonlinear transform device in the N-channel nonlinear transform unit is connected to corresponding inputs of the channel counter unit and the adder, wherein an output of the channel counter unit is connected to a first input of the divider, wherein an output of the threshold unit is connected to control inputs of averaging devices in the N-channel averaging unit and serve as the first output of the SNR estimation unit, based on which an abnormal decoder operation state binary signal is generated, and wherein the second output of the SNR estimation unit is an output of the divider, based on which the current SNR estimate is generated.

6. An apparatus for signal-to-noise ratio (SNR) estimation, the apparatus comprising:
   a branch metrics unit, a path calculation unit and a symbol generation unit, all connected in series;
   a memory connected to the path calculation unit;
   a decoding path estimation unit, where paths calculated by the path calculation unit converge; and
   an SNR estimation unit connected to the decoding path estimation unit,
   wherein an input of the decoding path estimation unit is connected to a first output of the memory,
   wherein a first output of the SNR estimation unit is connected to a first control input of branch metrics unit and to a control input of path calculation unit, and
   wherein a second output of the SNR estimation unit is connected to a second control input of branch metrics unit and represents a current SNR estimate.

7. The apparatus of claim 6, wherein a converging path length calculated by the decoding path estimation unit is a maximum difference between paths matrix column positions that have at least one element different from other columns.

8. The apparatus of claim 6, wherein a converging path length calculated by the decoding path estimation unit is a maximum difference between paths matrix column positions that have at least one element different from other columns, relative to a column corresponding to the current time instant.

9. The apparatus of claim 6, wherein the SNR estimation unit estimates the current SNR by:
   assigning a time interval for averaging an estimate of the decoding path length;
   finding an average estimate of the decoding path length; and
   calculating the current SNR estimate by using the average estimate of the decoding path length and a functional dependence on the SNR of the average decoding path length.

10. The apparatus of claim 6, wherein the SNR estimation unit includes an averaging unit, a nonlinear transform unit and a threshold unit, all connected in series.

11. The apparatus of claim 10, wherein an output of the threshold unit is connected to a control input of the averaging unit and serves as the first output of the SNR estimation unit based on which an abnormal decoder operation state signal is generated.

12. The apparatus of claim 11, wherein the second output of the SNR estimation unit is an output of the nonlinear transform unit, based on which the current SNR estimate is generated.

13. The apparatus of claim 11, wherein the abnormal decoder operation state signal is generated by comparing the current SNR estimate with a preset threshold value, and if current SNR estimate exceeds the threshold, then the abnormal decoder operation state signal is set to inactive, otherwise he abnormal decoder operation state signal is set to active.

14. The apparatus of claim 6, wherein the decoding path estimation unit includes:
   a plurality of combinational logic units, wherein a number of the combination logic units is equal to a decoding depth,
   wherein a number of inputs of each combinational logic unit is equal to a number of states of a convolutional coder; and
   a priority coder, whose number of inputs is equal to the number of combinational logic units,
   wherein an output of each combinational logic unit is connected to a corresponding input of the priority coder,
   wherein the input of the decoding path length estimation unit is connected to inputs of combinational logic units, and
   wherein an output of the decoding path estimation unit is the output of the priority coder.

15. The apparatus of claim 6, wherein the SNR estimation unit includes the following components, connected in series:
   an N-channel unit of difference counters;
   an N-channel unit of averaging devices;
   an N-channel nonlinear transform unit of nonlinear transform devices;
   an adder;
   a divider;
   a threshold unit; and
   a channel counter unit.

16. The apparatus of claim 15, wherein a first input of each difference counter has M channels, with M equal to a number of convolutional coder states.

17. The apparatus of claim 16, wherein a second input of each difference counter is single-channel,
   wherein all the second inputs of the difference counters are connected together and serve as the second input of the SNR estimation unit, and
   wherein the first input of the SNR estimation unit is a set of N first M-channel inputs of difference counters.

18. The apparatus of claim 17, wherein an output of each nonlinear transform device in the N-channel nonlinear transform unit is connected to corresponding inputs of the channel counter unit and the adder, and
   wherein an output of the channel counter unit is connected to a first input of the divider.

19. The apparatus of claim 18, wherein an output of the threshold unit is connected to control inputs of averaging devices in the N-channel averaging unit and serve as the first output of the SNR estimation unit based on which an abnormal decoder operation state signal is generated, and
   wherein the second output of the SNR estimation unit is an output of the divider based on which a signal corresponding to the current SNR estimate is generated.

* * * * *